United States Patent
Choi et al.

(10) Patent No.: US 7,102,283 B2
(45) Date of Patent: Sep. 5, 2006

(54) FULL-COLOR LIGHT EMITTING DEVICE WITH FOUR LEADS

(75) Inventors: Yong Chil Choi, Kyungki-do (KR); Seung Mo Park, Seoul (KR); Kyung Taeg Han, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 330 days.

(21) Appl. No.: 10/699,844

(22) Filed: Nov. 4, 2003

(65) Prior Publication Data

US 2004/0264184 A1 Dec. 30, 2004

(30) Foreign Application Priority Data

Jun. 25, 2003 (KR) ............... 10-2003-0041706

(51) Int. Cl.
*F21V 9/00* (2006.01)
(52) U.S. Cl. ............... 313/512; 313/498; 362/555; 362/800
(58) Field of Classification Search ......... 313/498, 313/512; 362/800, 555; 257/784
See application file for complete search history.

(56) References Cited

U.S. PATENT DOCUMENTS

| 6,179,449 B1 * | 1/2001 | Chen ..................... 362/293 |
| 2002/0004251 A1 * | 1/2002 | Roberts et al. ............ 438/26 |
| 2003/0161154 A1 * | 8/2003 | Ouyang et al. ........... 362/295 |

FOREIGN PATENT DOCUMENTS

| JP | 04-365382 | 12/1992 |
| JP | 9-167861 | 6/1997 |
| JP | 10-284757 | 10/1998 |

* cited by examiner

*Primary Examiner*—Ashok Patel
(74) *Attorney, Agent, or Firm*—Lowe Hauptman & Berner, LLP.

(57) ABSTRACT

A full-color light emitting device includes four leads and three light emitting diode chips which have different light emission wavelengths and can be individually controlled to realize emission of light beams of more diverse colors. The device has a simplified connection structure, so that it can be implemented even when a limited bonding area is provided.

15 Claims, 7 Drawing Sheets

FIG. 1

PRIOR ART

FIG. 2

PRIOR ART

FULL-COLOR LIGHT EMITTING DEVICE WITH FOUR LEADS

BACKGROUND OF THE INVENTION

1. Field of the Invention

The present invention relates to a full-color light emitting device capable of emitting light beams of three or more colors in which three light emitting diode chips thereof having different light emission wavelengths are individually adjusted in light emission density, so that it can emit light beams of three or more colors, and more particularly to a full-color light emitting device with four leads in which three light emitting diode chips thereof having different light emission wavelengths can be individually controlled to realize emission of light beams of more diverse colors, while having a simplified connection structure, so that the light emitting device can be implemented even in the case in which a limited bonding area is provided.

2. Description of the Related Art

Light emitting devices, which use semiconductor light emitting elements, are configured by arranging, for example, a plurality of light emitting diodes (LEDs) as light emitting semiconductor elements on a panel. In such a case, each LED emits red, green or blue light in accordance with the kind of its compound semiconductor.

In the case of a light emitting device adapted to emit monochrome light, using LEDs as semiconductor light emitting elements, each LED constitutes one pixel. In the case of a light emitting device adapted to emit full-color light composed of the three primary colors, that is, red (R), green (G), and blue (B), using LEDs, each light emitting element thereof consists of three LEDs of red, green, and blue, that is, the three primary colors. In the latter case, each full-color light emitting element constitutes one pixel.

Figure 1:
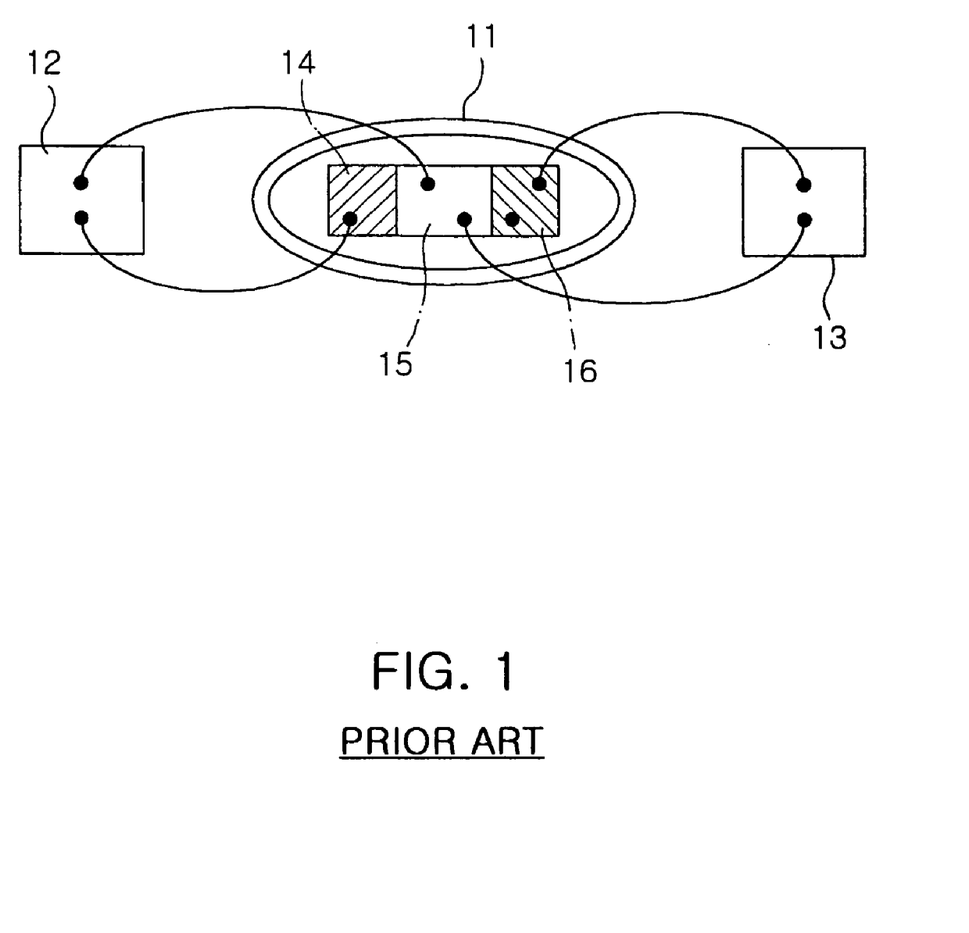
FIG. 1 is a plan view schematically illustrating a conventional 3-lead full-color light emitting device.

FIG. 1 illustrates a conventional full-color light emitting device for one light emitting element thereof. As shown in FIG. 1, first through third LEDs 14 to 16 are mounted on a main lead 11. The first LED 14 has a first electrode electrically connected to the main lead 11 in accordance with a die-bonding method, and a second electrode electrically connected to a first sub-lead 12 at its second electrode in accordance with a wire-bonding method. The second LED 15 has first and second electrodes respectively electrically connected to the first sub-lead 12 and a second sub-lead 13 in accordance with a wire-bonding method. The third LED 16 has a first electrode electrically connected to the main lead 11 in accordance with a die-bonding method, and a second electrode electrically connected to the second sub-lead 13 in accordance with a wire-bonding method. The first and second electrodes of each LED may be an anode and a cathode, or vice versa, respectively.

In each of the first and third LEDs 14 and 16, one of its anode and cathode is arranged on the upper surface of its chip, whereas the remaining electrode is arranged on the lower surface of the chip. The electrode arranged on the lower chip surface is electrically connected to the main lead 11 in accordance with a die-bonding method, whereas the electrode arranged on the upper chip surface is electrically connected to an associated one of the first and second sub leads 12 and 13 in accordance with a wire-bonding method. On the other hand, in the case of the second LED 15, both electrodes thereof are arranged on the upper surface of its chip. In this case, the chip of the second LED 15 is mounted on the main lead 11 such that its lower surface is in contact with the main lead 11 via an insulating substrate. In this state, the electrodes on the upper chip surface are electrically connected to the first and second sub-leads 12 and 13 in accordance with a wire-bonding method, respectively.

The first LED 14 is an red (R) LED, the second LED 15 is a green (G) LED, and the third LED 16 is a blue (B) LED.

Figure 2:
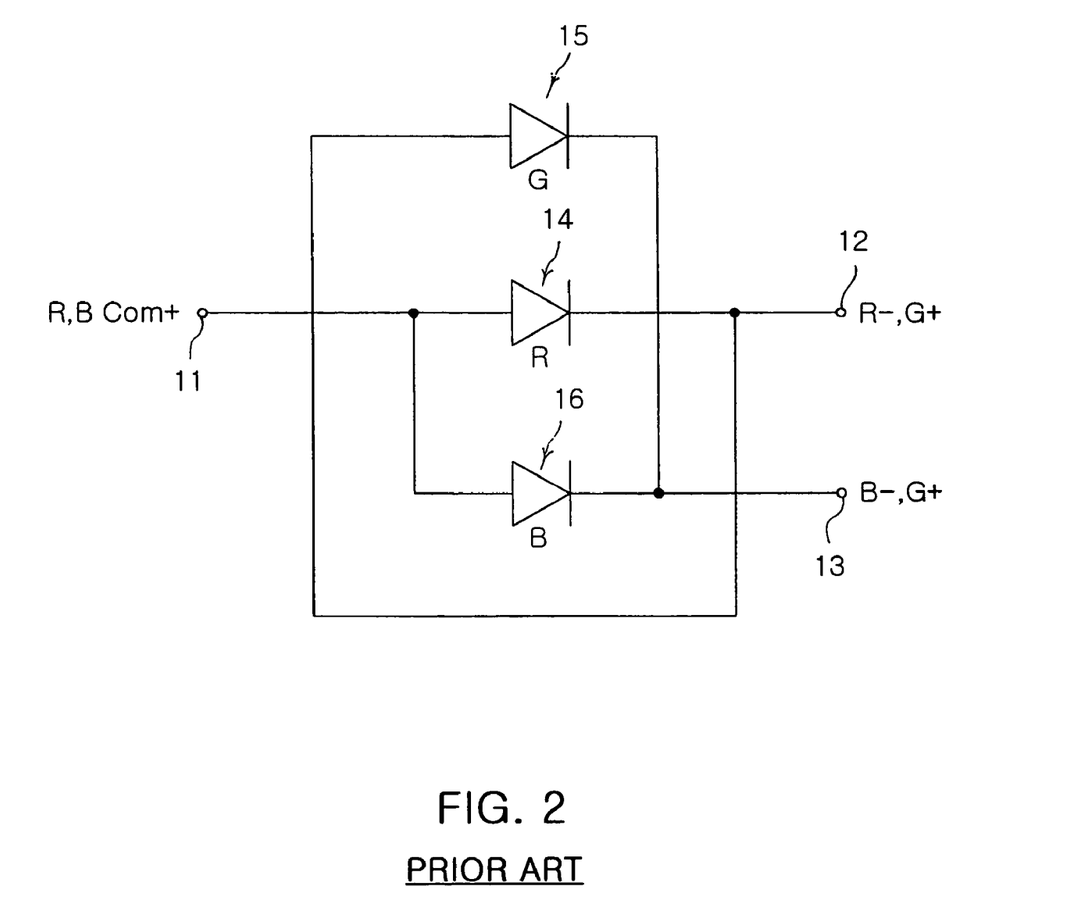
FIG. 2 is an equivalent circuit diagram of the 3-lead full-color light emitting device shown in FIG. 1.

FIG. 2 illustrates an equivalent circuit of the full-color light emitting device implemented as shown in FIG. 1.

Now, operation of the full-color light emitting device will be described with reference to the equivalent circuit of FIG. 2. The color of light emitted from the light emitting device can be adjusted by controlling respective voltages applied to the three leads 11 to 13, thereby controlling respective operations of the first through third LEDs 14 to 16.

For instance, when a "+" voltage is applied to the main lead 11, and a "−" voltage is applied to the first sub-lead 12, the first LED 14 is activated. When the "+" voltage is applied to the main lead 11, and the "−" voltage is applied to the second sub-lead 12, the third LED 16 is activated. On the other hand, when the "+" voltage is applied to the first sub-lead 12, and the "−" voltage is applied to the second sub-lead 13, the second LED 15 is activated. When each LED of the full-color light emitting device is activated, it serves as a red, green or blue light source.

However, the above mentioned conventional full-color light emitting device has a high possibility of error generation because its operation condition is determined in accordance with the polarity of the control voltage applied to each of the first and second sub-lead 12 and 13.

Furthermore, the conventional full-color light emitting device has a complex electrical circuit configuration for implementation of full-color light emission, as shown in FIG. 2, because it uses a small number of lead frames.

In the above mentioned structure, there is also a problem in that it is difficult to configure a desired circuit where each of the LEDs 14 and 16, to which a die-bonding technique is to be applied, only has two or more wire bonding pads due to the substrate material of its chip.

Figure 3:
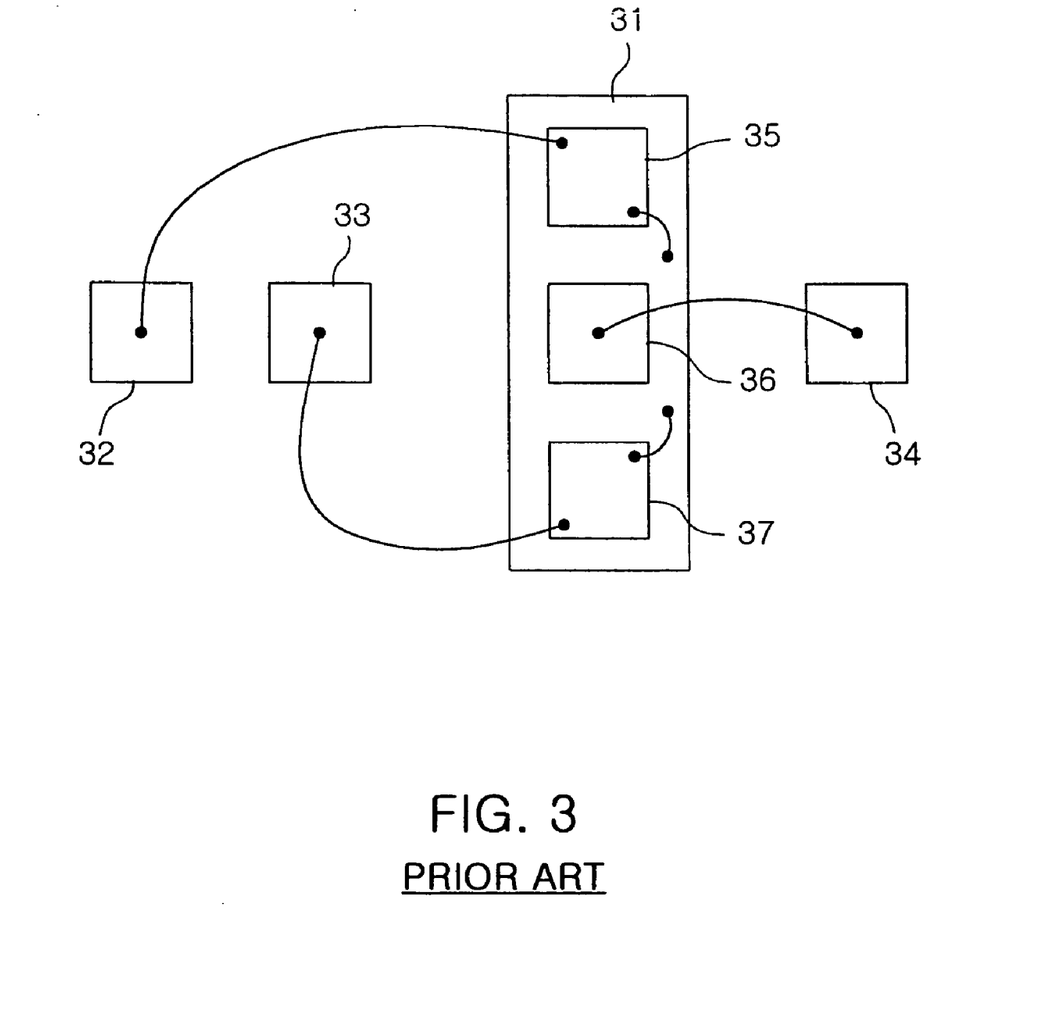
FIG. 3 is a plan view schematically illustrating a conventional 4-lead full-color light emitting device.
Figure 4:
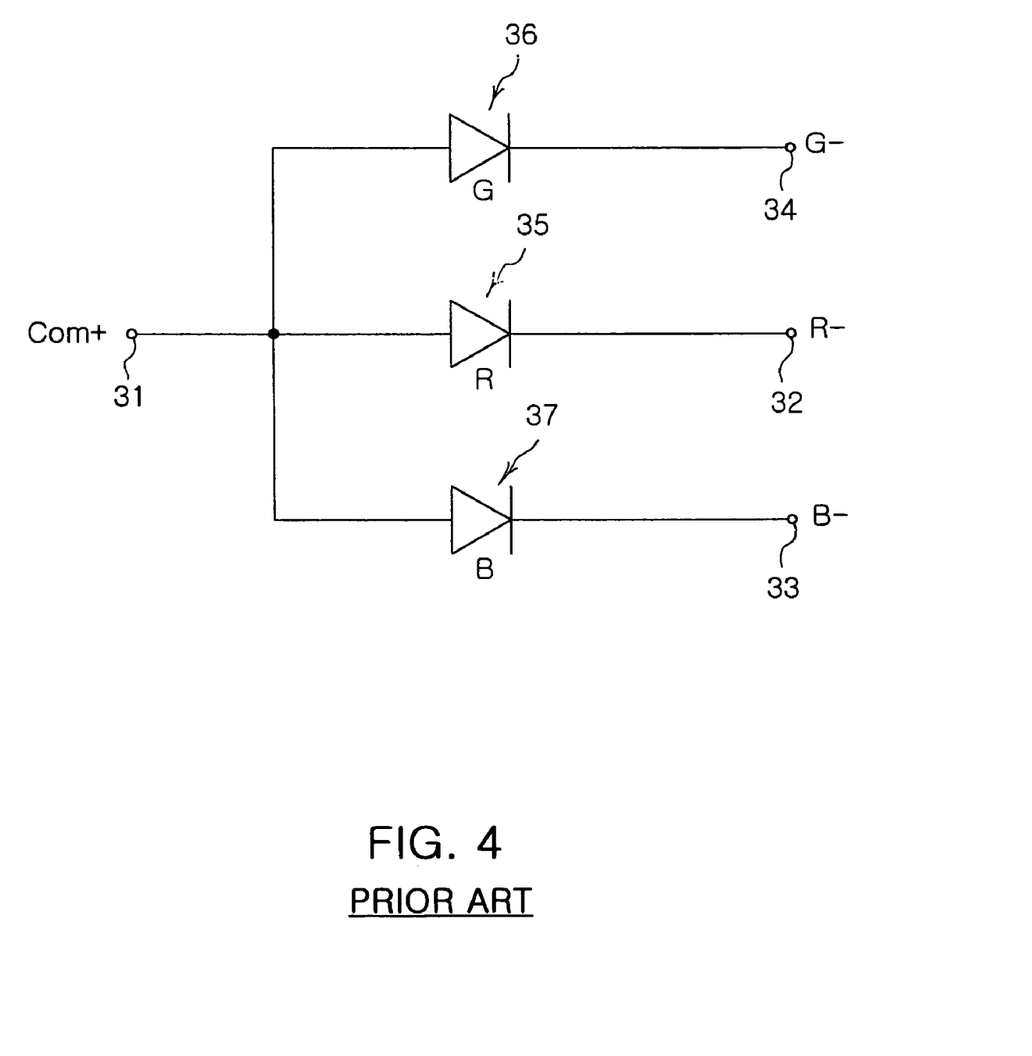
FIG. 4 is an equivalent circuit diagram of the 4-lead full-color light emitting device shown in FIG. 3.

FIG. 3 is a plan view illustrating another conventional full-color light emitting device with four leads. FIG. 4 illustrates an equivalent circuit of the full-color light emitting device shown in FIG. 3.

The full-color light emitting device shown in FIGS. 3 and 4 includes an R LED 35, a G LED 36, and a B LED 37 which have different light emission wavelengths, respectively. The R, G, and B LEDs 35 to 37 are bonded to a main lead frame 31 by means of an adhesive. The LEDs 35 to 37 are electrically connected to first through third sub-lead frames 32 to 34 for supply of electric power, respectively, while being electrically connected to the main lead frame 31 as a common electrode.

The electrical connection of each LED is achieved in accordance with a die-bonding method and a wire-bonding method using electrical connecting members (for example, conductive wires).

In this full-color light emitting device, as shown in FIG. 4, each of the three LEDs 35 to 37 is connected to the main lead frame 31 at one electrode thereof (anode) while being connected to an associated one of the first through third sub-lead frames 32 to 34 at the other electrode thereof (cathode). Each of the first through third LEDs 35 to 37 is turned on/off when the control voltage to be applied to an associated one of the first through third sub-lead frames 32 to 34 is switched on/off. Light beams emitted from the LEDs 35 to 37 in their ON state are mixed so that light of full color including red, green and blue, and mixed colors thereof is generated.

This conventional 4-lead full-color light emitting device can have a simple circuit configuration, as shown in FIG. 4.

However, the main lead frame 31 must have a substantial area because the first through third LEDs 31 to 33 are commonly connected to the main lead frame 31 at their one-side ends. For this reason, where the full-color light emitting device has a limited size, an insufficient bonding area may be provided.

In other words, the above mentioned conventional 4-lead full-color light emitting device has a problem in that it cannot implement a full-color light emitting device including a main lead frame having a limited area.

SUMMARY OF THE INVENTION

The present invention has been made in view of the above mentioned problems involved with the related art, and an object of the invention is to provide a full-color light emitting device with four leads in which three light emitting diode chips thereof having different light emission wavelengths can be individually controlled to realize emission of light beams of more diverse colors, while having a simplified connection structure, so that the light emitting device can be implemented even in the case in which a limited bonding area is provided.

In accordance with one aspect, the present invention provides a 4-lead full-color light emitting device comprising: first through third sub-lead frames respectively having first through third leads each made of a conductive material, and wire bonding pads each formed at one end of an associated one of the first through third leads; a main lead frame having a fourth lead made of a conductive material, and a reflecting cup formed at one end of the fourth lead while having a side wall and a bottom surface, the reflecting cup being formed with a reflecting surface at an inner surface of the side wall while having, at the bottom surface, an insulating portion, and a non-insulating portion electrically connected to the fourth lead; and first through third light emitting diodes (LEDs) of different light emitting wavelengths mounted on the bottom surface of the reflecting cup in the main lead frame, each of the LEDs having first and second electrodes of different characteristics; wherein the first electrode of the first LED and the first electrode of the second LED are commonly electrically connected to the first lead of the first sub-lead frame; wherein the second electrode of the second LED and the first electrode of the third LED are commonly electrically connected to the second lead of the second sub-lead frame; wherein the second electrode of the first LED is electrically connected to the fourth lead of the main lead frame; and wherein the second electrode of the third LED is electrically connected to the third lead of the third sub-lead frame.

The electrical connection of the second electrode of the first LED to the third lead of the main lead frame may be achieved by die-bonding the second electrode of the first LED to the bottom surface of the reflecting cup in the main lead frame, using a conductive bonding agent.

The electrode-to-lead electrical connection of the first through third LEDs to the first through third sub-lead frames may be achieved in accordance with a wire-bonding method.

The mounting of the second and third LEDs to the main lead frame may be achieved by die-bonding the second and third LEDs to the bottom surface of the reflecting cup in the main lead frame, using a non-conductive bonding agent.

Preferably, the bottom surface of the reflecting cup in the main lead frame has a circular or oval shape.

In accordance with another aspect, the present invention provides a 4-lead full-color light emitting device comprising: first through light emitting diodes (LEDs) of different light emission wavelengths, each of the LEDs having first and second electrodes; a first lead connected to respective first electrodes of the first and second LEDs, and adapted to apply a first control voltage to the first electrodes of the first and second LEDs; a second lead connected to both the second electrode of the second LED and the first electrode of the third LED, and adapted to apply a second control voltage to the second electrode of the second LED and the first electrode of the third LED; a third lead connected to the second electrode of the third LED, and adapted to apply a third control voltage to the second electrode of the third LED; and a fourth lead connected to the second electrode of the first LED, and adapted to apply a fourth control voltage to the second electrode of the first LED.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENTS

Now, preferred embodiments of the present invention relating to a 4-lead full-color light emitting device will be described.

Figure 5:
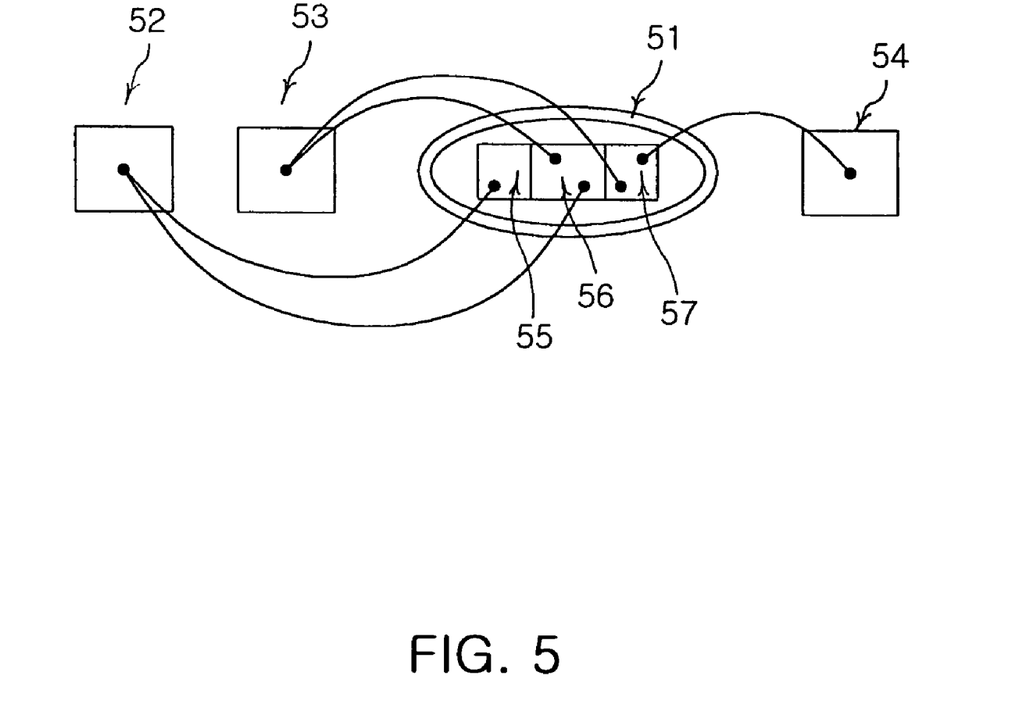
FIG. 5 is a plan view schematically illustrating a full-color light emitting device according to the present invention.

FIG. 5 is a plan view illustrating a 4-lead full-color light emitting device according to the present invention. As shown in FIG. 5, the full-color light emitting device designated by the reference numeral includes first through third sub-lead frames 52 to 54 respectively provided with first through third leads, a main lead frame 51 provided with a fourth lead made of a conductive material, and a reflecting cup having a side wall and a bottom surface, and first through third LEDs 55 to 57 of different light emission wavelengths mounted on the bottom surface of the reflecting cup in the main lead frame 51. The reflecting cup of the main lead frame 51 is formed with a reflecting surface at the inner surface of its side wall while having, at its bottom surface, an insulating portion, and a non-insulating portion electrically connected to the fourth lead. Each of the LEDs 55 to 57 has two electrodes having different characteristics, that is, first and second electrodes. The first electrode of the first LED 55 and the first electrode of the second LED 56 are commonly electrically connected to the first lead of the first sub-lead frame 52. The second electrode of the second LED 56 and the first electrode of the third LED 57 are commonly electrically connected to the second lead of the second sub-lead frame 53. The second electrode of the first LED 55 is electrically connected to the fourth lead of the main lead frame 51. The third LED 57 is electrically connected at its second electrode to the third lead of the third sub-lead frame 54.

The electrode-to-lead electrical connection of the first through third LEDs 55 to 57 to the first through third sub-lead frames 52 to 54 is achieved by bonding an electrical connecting member, for example, a conductive wire, to bonding pads respectively provided at each electrode and each lead, to be connected to each other, in accordance with a wire-bonding technique.

The electrical connection of the first LED 55 to the main lead frame 51 at its second electrode is achieved in accordance with a die-bonding technique. Although the second electrode of the first LED 55 has a structure for implementing a die-bonding process for its electrical connection, it may have a structure capable of implementing a wire-bonding process for its electrical connection.

In the full-color light emitting device having the above described configuration, its bonding to the main lead frame 51, on which the LEDs 55 to 57 are mounted, is achieved only at one site. Accordingly, although two or more electrodes for wire-bonding connection are provided by the first through third LEDs 55 to 57, the main lead frame 51 may have a bonding area for only one bonding site.

Where the first LED 55 has a die-bonding structure at one electrode thereof, for example, the second electrode thereof, this second electrode is bonded to the non-insulating portion of the main lead frame 55 by use of a fluxing agent or adhesive. In this case, the main lead frame 55 may have only an area for mounting the three LEDs 55 to 57 thereon.

The main lead frame 51 has an oval reflecting cup structure formed with a reflecting surface at its inner surface. As described above, the first through third LEDs 55 to 57 are mounted on the bottom surface of the reflecting cup. The first LED 55 is directly bonded to the lead frame 51 at its second electrode formed on its lower surface, using a conductive material such as Ag. On the other hand, each of the second and third LEDs 56 and 57 is bonded to the lead frame 51 at its surface opposite to its surface formed with its first and second electrodes, that is, at its lower surface, using a non-conductive material such as epoxy. The reflecting cup of the main lead frame 51 may have a round structure.

The first LED 55 is bonded to the first lead of the first sub-lead frame 52 at its first electrode formed on its upper surface by bonding opposite ends of an Au wire to bond pads respectively formed on the first electrode of the first LED 55 and the first lead. Similarly, each of the second and third LEDs 56 and 57 is bonded to the lead of an associated one of the second and third sub-lead frames 53 and 54 at each of its first and second electrodes by bonding opposite ends of an Au wire to bond pads respectively formed on the electrode of the LED and the associated lead.

The first through third LEDs 55 to 57 have red, green, and blue light emission wavelengths, respectively.

Figure 6:
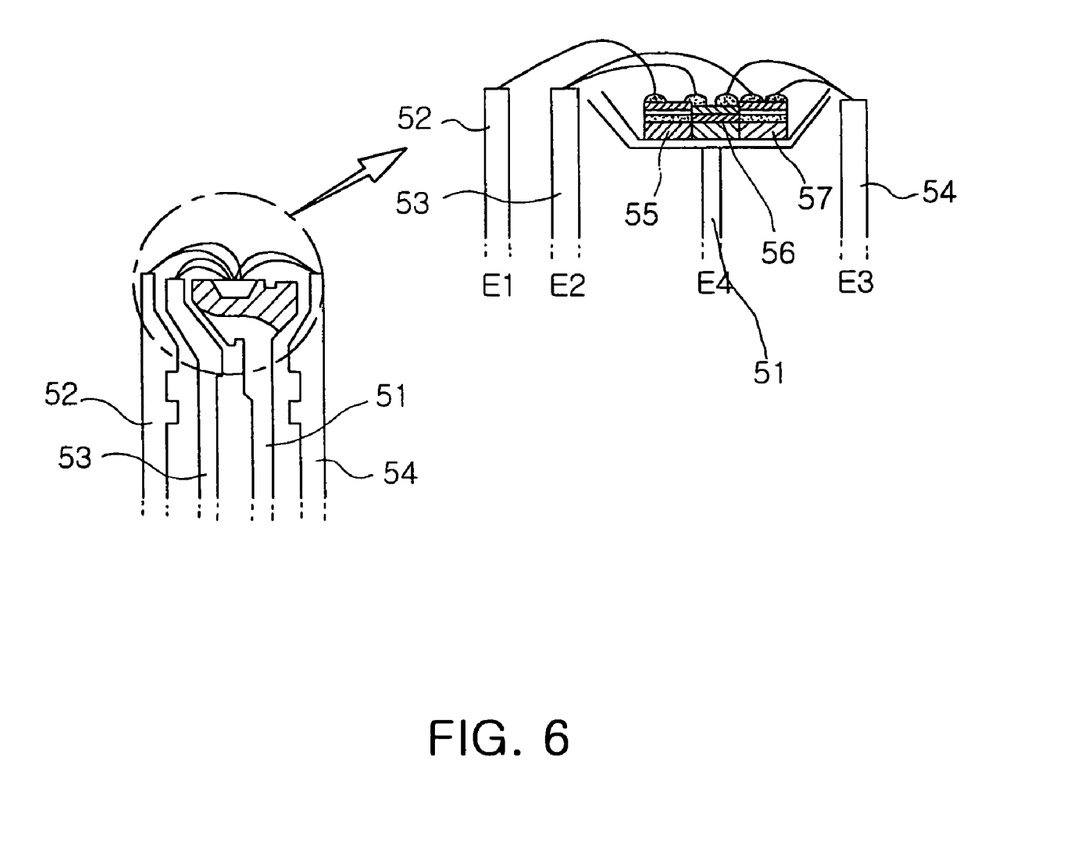
FIG. 6 is a sectional view schematically illustrating the full-color light emitting device according to the present invention.

FIG. 6 is a sectional view illustrating the full-color light emitting device according to the present invention. Referring to FIG. 6, respective cross-sectional shapes of the main lead frame 51 and first through third sub-lead frames 52 to 54 are shown.

The sub-lead frames 52 to 54 have lead portions E1 to E3 made of a conductive material while extending vertically to have a certain vertical length, respectively. Respective lead portions E1 to E3 of the sub-lead frames 52 to 54 correspond to the above described first through third leads. Accordingly, these lead portions E1 to E3 will be referred to as the first through third leads, respectively. Each of the first through third leads E1 to E3 has a certain area at its upper end to provide a wire-bonding area. Each of the first through third leads E1 to E3 is mounted to a printed circuit board at its lower end.

The main lead frame 51 has a lead portion E4 made of a conductive material while extending vertically to have a certain vertical length. The lead portion E4 of the main lead frame 51 corresponds to the above described fourth lead. Accordingly, this lead portion E4 will be referred to as the fourth lead. The main lead frame 51 also has a cup-shaped mounting portion 511 formed at the upper end of the fourth lead E4 and adapted to carry a chip thereon. The cup-shaped mounting portion 511 corresponds to the above described reflecting cup. Accordingly, the cup-shaped mounting portion 511 will be referred to as the reflecting cup.

The reflecting cup 511 has an oval or circular shape at its bottom surface. A reflecting material is coated over the inner surface of the side wall of the reflecting cup 511 so as to form a reflecting surface. The first through third LEDs 55 to 57 are mounted on the bottom surface of the reflecting cup 511 within the reflecting cup 511. Light emitted from each of the first through third LEDs 55 to 57 is reflected by the reflecting surface of the reflecting cup 511, and then upwardly advanced.

Such structures of the main lead frame 51 and first through third sub-lead frames 52 to 54 are well known as the lead frame structures of a general full-color light emitting device (for example, a lamp). The full-color light emitting device of the present invention is not limited to the structure of FIG. 6.

Figure 7:
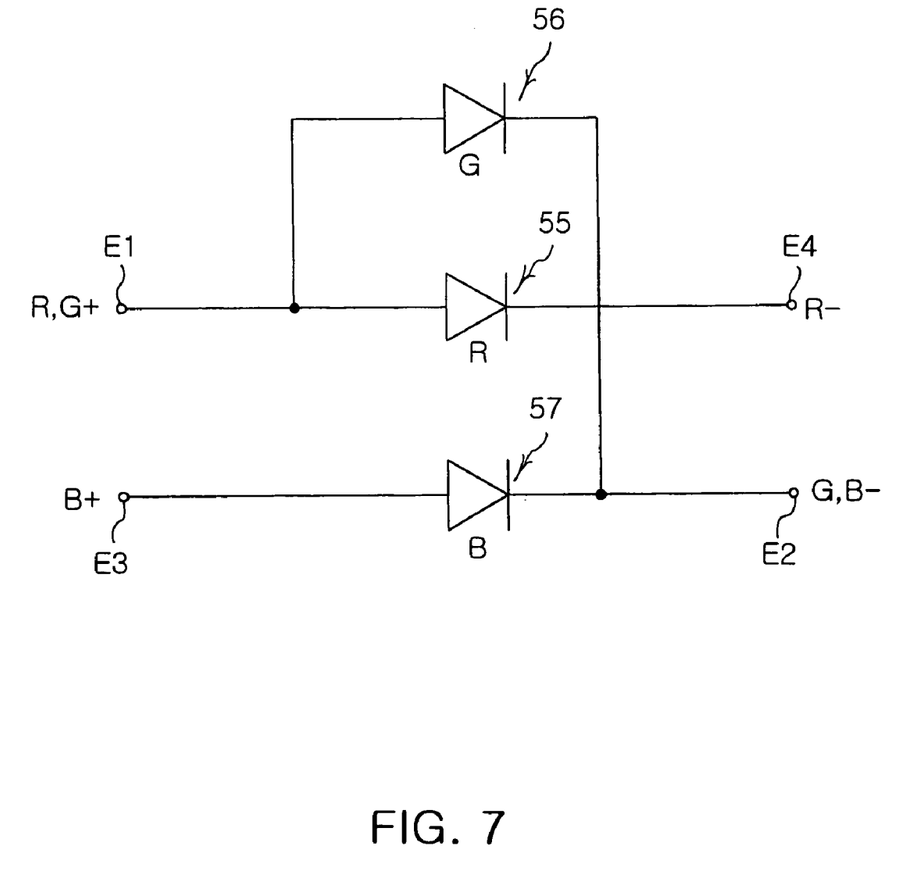
FIG. 7 is an equivalent circuit diagram of the full-color light emitting device according to the present invention.

The electrical circuit configuration of the full-color light emitting device implemented as described above in accordance with the present invention can be represented by an equivalent circuit shown in FIG. 7.

Referring to FIG. 7, the circuit configuration of the full-color light emitting device includes the first through third LEDs 55 to 57 having different light emission wavelengths, and the first through fourth leads E1 to E4. Respective anodes of the first and second LEDs 55 and 56 are commonly connected to the first lead E1, whereas respective cathodes of the second and third LEDs 56 and 57 are commonly connected to the second lead E2. The anode of the third LED 57 alone is connected to the third lead E3, whereas the cathode of the first LED 55 alone is connected to the fourth lead E4.

In this circuit configuration, emission of light of full color including three primary colors, that is, red, green, blue, and mixtures of at least two of the three primary colors can be achieved by applying a "+" voltage to one or both of the first and third leads E1 and E3 while applying a "−" voltage to one or both of the second and fourth leads E2 and E4.

The level of the control voltage applied to each of the first through fourth leads E1 to E4 is set to an appropriate operating level in accordance with the kind of the first through third LEDs 55 to 57.

The first LED 55 is a red (R) LED, the second LED 56 is a green (G) LED, and the third LED 57 is a blue (B) LED.

The operation of the above described circuit configuration will now be described in more detail. When 0V is applied to the first lead E1, and −1.9V is applied to the fourth lead E4, the first LED 55 is activated, thereby emitting light of a first wavelength (red). On the other hand, when 0V is applied to the first lead E1, and −3.0V is applied to the second lead E2, the second LED 56 is activated, thereby emitting light of a second wavelength (green). Also, when 0V is applied to the first lead E1, and −3V and −1.9V are applied to the second and fourth leads E2 and E4, respectively, the first and second LEDs 55 and 56 are activated, thereby emitting light of a mixed color of first and second wavelengths (that is, a mixed color of red and green), that is, yellow.

When 0V is applied to the third lead E3, and −3.0V is applied to the second lead E2, the third LED 57 is activated, thereby emitting light of a third wavelength (blue).

On the other hand, when 0V is applied to both the first lead E1 and the third lead E3, and −3.0V is applied to the second lead E2, the second and third LEDs 56 and 57 are activated, thereby emitting light of a mixed color of second and third wavelengths (that is, a mixed color of green and blue), that is, cyan.

Also, when 0V is applied to both the first lead E1 and the third lead E3, and −3.0V and −1.9V are applied to the second and fourth leads E2 and E4, respectively, all the first through third LEDs 55 to 57 are activated, thereby emitting light of a second wavelength (green). Also, when 0V is applied to the first lead E1, and −3V and −1.9V are applied to the second and fourth leads E2 and E4, respectively, the first and second LEDs 55 and 56 are activated, thereby emitting light of a mixed color of red, green and blue, that is, white.

Thus, the full-color light emitting device according to the present invention can emit light of full color by adjusting respective control voltages of the first through fourth leads E1 to E4.

As apparent from the above description, the present invention provides a full-color light emitting device which includes four leads in order to independently control three LEDs of different light emission wavelengths, while reducing the number of bonding sites on a main lead frame, on which the three LEDs are mounted, to one, thereby being capable of implementing a 4-lead full-color light emitting device even where the main lead frame has a limited bonding space.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A 4-lead fall-color light emitting device comprising:
   first through third sub-lead frames respectively having first through third leads each made of a conductive material, and wire bonding pads each formed at one end of an associated one of the first through third leads;
   a main lead frame having a fourth lead made of a conductive material, and a reflecting cup formed at one end of the fourth lead while having a side wall and a bottom surface, the reflecting cup being formed with a reflecting surface at an inner surface of the side wall while having, at the bottom surface, an insulating portion, and a non-insulating portion electrically connected to the fourth lead; and
   first through third light emitting diodes (LEDs) of different light emitting wavelengths mounted on the bottom surface of the reflecting cup in the main lead frame, each of the LEDs having first and second electrodes of different characteristics;
   wherein the first electrode of the first LED and the first electrode of the second LED are commonly electrically connected to the first lead of the first sub-lead frame;
   wherein the second electrode of the second LED and the first electrode of the third LED are commonly electrically connected to the second lead of the second sub-lead frame;
   wherein the second electrode of the first LED is electrically connected to the fourth lead of the main lead frame; and
   wherein the second electrode of the third LED is electrically connected to the third lead of the third sub-lead frame.

2. The 4-lead full-color light emitting device according to claim 1, wherein the second electrode of the first LED is die-bonded to the bottom surface of the reflecting cup in the main lead frame using a conductive bonding agent which realizes the electrical connection of the second electrode of the first LED to the fourth lead of the main lead frame.

3. The 4-lead full-color light emitting device according to claim 1, further comprising bonding wires electrically connecting the first through third LEDs to the respective ones of the first through third sub-lead frames.

4. The 4-lead full-color light emitting device according to claim 1, wherein the second and third LEDs are die-bonded to the bottom surface of the reflecting cup in the main lead frame using a non-conductive bonding agent, thereby mounting the second and third LEDs on the main lead frame.

5. The 4-lead full-color light emitting device according to claim 1, wherein the bottom surface of the reflecting cup in the main lead frame has a circular or oval shape.

6. The 4-lead full-color light emitting device according to claim 1, wherein the first LED is adapted to emit light of a red wavelength, the second LED is adapted to emit light of a green wavelength, and the third LED is adapted to emit light of a blue wavelength.

7. A 4-lead full-color light emitting device comprising:
   first through third light emitting diodes (LEDs) of different light emission wavelengths, each of the LEDs having first and second electrodes;
   a first lead electrically connected to the first electrodes of the first and second LEDs, and adapted to apply a first control voltage to the first electrodes of the first and second LEDs;
   a second lead electrically connected to bath the second electrode of the second LED and the first electrode of the third LED, and adapted to apply a second control voltage to the second electrode of the second LED and the first electrode of the third LED;
   a third lead electrically connected to the second electrode of the third LED, and adapted to apply a third control voltage to the second electrode of the third LED; and
   a fourth lead electrically connected to the second electrode of the first LED, and adapted to apply a fourth control voltage to the second electrode of the first LED.

8. The 4-lead full-color light emitting device according to claim 7, wherein said third lead is different from said fourth lead.

9. The 4-lead fill-color light emitting device according to claim 8, wherein said third control voltage is different from said fourth control voltage.

10. The 4-lead full-color light emitting device according to claim 7, wherein said third control voltage is different from said fourth control voltage.

11. The 4-lead full-color light emitting device according to claim 7, wherein said third lead is not electrically connected to the second electrode of the first LED.

12. The 4-lead full-color light emitting device according to claim 11, wherein said fourth lead is not electrically connected to the second electrode of the third LED.

13. The 4-lead full-color light emitting device according to claim 7, wherein said fourth lead is not electrically connected to the second electrode of the third LED.

14. The 4-lead full-color light emitting device according to claim 7, wherein
said first and third voltages are positive whereas said second and fourth voltages are negative; and
said third and fourth leads are adapted to simultaneously apply said third, positive control voltage to the second electrode of the third LED and said fourth, negative control voltage to the second electrode of the first LED, respectively.

15. The 4-lead full-color light emitting device according to claim 7, wherein
said first electrodes of the first and second LEDs and the second electrode of the third LED are anodes;
said second electrodes of the first and second LEDs and the first electrode of the third LED are cathodes; and
said first, second and third LEDs are configured to emit light of red, green and blue wavelengths, respectively.

* * * * *